United States Patent
Beckman et al.

(10) Patent No.: US 10,526,091 B2
(45) Date of Patent: Jan. 7, 2020

(54) MOBILE PLATFORM THERMAL MANAGEMENT SYSTEMS AND METHODS

(71) Applicant: The Boeing Company, Chicago, IL (US)

(72) Inventors: Mary Eileen Beckman, West Chester, PA (US); Mark Steven Kuehn, Gilbert, AZ (US); Robert Herkimer, Savannah, GA (US)

(73) Assignee: The Boeing Company, Chicago, IL (US)

( * ) Notice: Subject to any disclaimer, the term of this patent is extended or adjusted under 35 U.S.C. 154(b) by 1183 days.

(21) Appl. No.: 14/559,875

(22) Filed: Dec. 3, 2014

(65) Prior Publication Data

US 2016/0325841 A1 Nov. 10, 2016

(51) Int. Cl.
| | | |
|---|---|---|
| *B64D 13/08* | (2006.01) | |
| *B60H 1/00* | (2006.01) | |
| *B64D 47/00* | (2006.01) | |
| *H05K 7/20* | (2006.01) | |

(52) U.S. Cl.
CPC ......... *B64D 13/08* (2013.01); *B60H 1/00564* (2013.01); *B64D 47/00* (2013.01); *H05K 7/2059* (2013.01); *H05K 7/20572* (2013.01); *B60H 2001/00614* (2013.01)

(58) Field of Classification Search
CPC .... B64D 13/08; B64D 47/00; B60H 1/00564; H05K 7/20572; H05K 7/2059
USPC .................................................... 454/76, 909
See application file for complete search history.

(56) References Cited

U.S. PATENT DOCUMENTS

| | | | | |
|---|---|---|---|---|
| 4,711,159 A | * | 12/1987 | Armbruster | B60H 1/247 454/137 |
| 5,253,484 A | * | 10/1993 | Corman | B64D 13/00 454/76 |
| 6,527,005 B2 | * | 3/2003 | Weaver | E02D 31/008 137/312 |
| 7,119,700 B2 | | 10/2006 | Rotta et al. | |
| 7,363,879 B2 | * | 4/2008 | Bonner | A01K 1/0035 119/417 |
| 2011/0265449 A1 | * | 11/2011 | Powell | B63H 21/32 60/272 |
| 2012/0298337 A1 | * | 11/2012 | Tiwari | H05K 7/2059 165/104.26 |

(Continued)

*Primary Examiner* — Steven B McAllister
*Assistant Examiner* — Allen R Schult
(74) *Attorney, Agent, or Firm* — Kolisch Hartwell, P.C.

(57) ABSTRACT

A system for cooling a plurality of electrical equipment components inside a mobile platform may include at least one manifold and a plurality of flexible tubing ducts. The manifold may have an outlet, and a plurality of inlet tubing connections in fluid communication with the outlet. The outlet may be coupled to an interface of a cooling system of the platform by exhaust tubing. Each of the flexible tubing ducts may have a proximal end and a distal end. Each proximal end may be selectively connectable to the inlet tubing connections. Each distal end may have an air intake port that is alternatively positionable in two or more thermal dissipation zones of the electrical equipment components for permitting an exhaust profile inside the platform to the interface to be reconfigured based at least in part on respective positions of the electrical equipment components.

20 Claims, 8 Drawing Sheets

(56) References Cited

U.S. PATENT DOCUMENTS

2014/0094103 A1\* 4/2014 Dreyhaupt ......... B60H 1/00457
454/76

\* cited by examiner

MOBILE PLATFORM THERMAL MANAGEMENT SYSTEMS AND METHODS

FEDERALLY SPONSORED RESEARCH AND DEVELOPMENT

One or more inventions disclosed herein was made with Government support under contract number W15P7T-11-C-S801 awarded by the Department of Defense. The Government has certain rights in said invention or inventions.

FIELD

This disclosure relates to thermal management systems. More specifically, the disclosed embodiments relate to systems and methods for convectively cooling electrical equipment components within a mobile platform.

INTRODUCTION

In some cases, a mobile platform, such as an intelligence, surveillance, and reconnaissance (ISR) aircraft, may be reconfigured to support one or more particular missions and/or types of missions. Such reconfiguration may involve installing additional electrical equipment components (e.g., heat-generating avionics systems) within a compartment of the mobile platform, re-arranging electrical equipment components within the compartment, and the like, which may create hot spots or otherwise increase or change a thermal profile within the compartment. However, a pre-existing cooling system of the mobile platform may have a limited capacity and may not provide direct cooling to locations where the electrical equipment components are installed in the reconfiguration. Such a lack of cooling may limit an amount of electrical equipment components that may be installed within the compartment, and/or may limit mission effectiveness of the mobile platform.

An existing solution involves adding a second cooling system to the mobile platform. However, such an addition of a second cooling system is both heavy and costly, typically requiring significant space, significant electrical power from the platform, and additional cooling air.

SUMMARY

Disclosed herein are examples of apparatuses, methods and systems, which may address the above mentioned problems, among others.

In one example, a system for cooling a plurality of electrical equipment components inside an aircraft may comprise at least one manifold and a plurality of flexible tubing ducts. The manifold may have an outlet and a plurality of inlet tubing connections. The plurality of inlet tubing connections may be in fluid communication with the outlet. Each of the plurality of inlet tubing connections may be connectable to a removable cover for covering the respective inlet tubing connection. The outlet may be coupled to an interface of a cooling system of the aircraft by exhaust tubing. Each of the tubing ducts of the plurality of flexible tubing ducts may have a proximal end and a distal end. Each proximal end may be selectively connectable to the plurality of inlet tubing connections in place of a removable cover. Each distal end may have an air intake port that is alternatively positionable in two or more thermal dissipation zones of the electrical equipment components for permitting an exhaust profile inside the aircraft to the interface to be reconfigured based at least in part on respective positions of the electrical equipment components inside the aircraft.

In another example, an apparatus may comprise a manifold having an outlet and a plurality of inlets in fluid communication with the outlet. The outlet may be configured for fluid communication with an exhaust duct of a cooling system of a mobile platform. The mobile platform may have a compartment in which a plurality of electrical equipment components are installed. Each inlet may be selectively connectable to an individual tubing duct. Each individual tubing duct may be extendable to a convective heat zone of at least one of the electrical equipment components, thereby permitting a thermal exhaust profile of the compartment to be incrementally altered to address a change in installation of the electrical equipment components within the compartment.

In another example, a system for cooling a plurality of heat-generating electrical equipment components inside a compartment of a mobile platform may comprise a plurality of flexible tubing ducts. The plurality of flexible tubing ducts may be disposed in the compartment. Each tubing duct may have a distal end and a proximal end. Each distal end may include an air intake port that is alternatively positionable between two or more spaced apart thermal dissipation zones associated with an installation of the electrical equipment components. Each proximal end may be configured to place the associated air intake port in fluid communication with an exhaust portion of a cooling system of the mobile platform, thereby permitting an exhaust profile inside the compartment to be reconfigured based at least in part on the installation of the electrical equipment components.

In another example, a method may comprise altering a hardware configuration from a first state to a second state within a compartment of a mobile platform. The hardware configuration in the first state may have a thermally convective first profile. The hardware configuration in the second state may have a thermally convective second profile that is distinct from the first profile. The method may further comprise altering an exhaust duct configuration, extending from at least one exhaust manifold disposed within the compartment, from a first arrangement that compliments the first profile to a second arrangement that compliments the second profile and is distinct from the first arrangement. The exhaust manifold may have an outlet in fluid communication with both the exhaust duct configuration and an interface of a cooling system of the mobile platform.

Features, functions, and advantages may be achieved independently in various embodiments of the present disclosure, or may be combined in yet other embodiments, further details of which can be seen with reference to the following description and drawings.

DESCRIPTION

Overview

Figure 1:
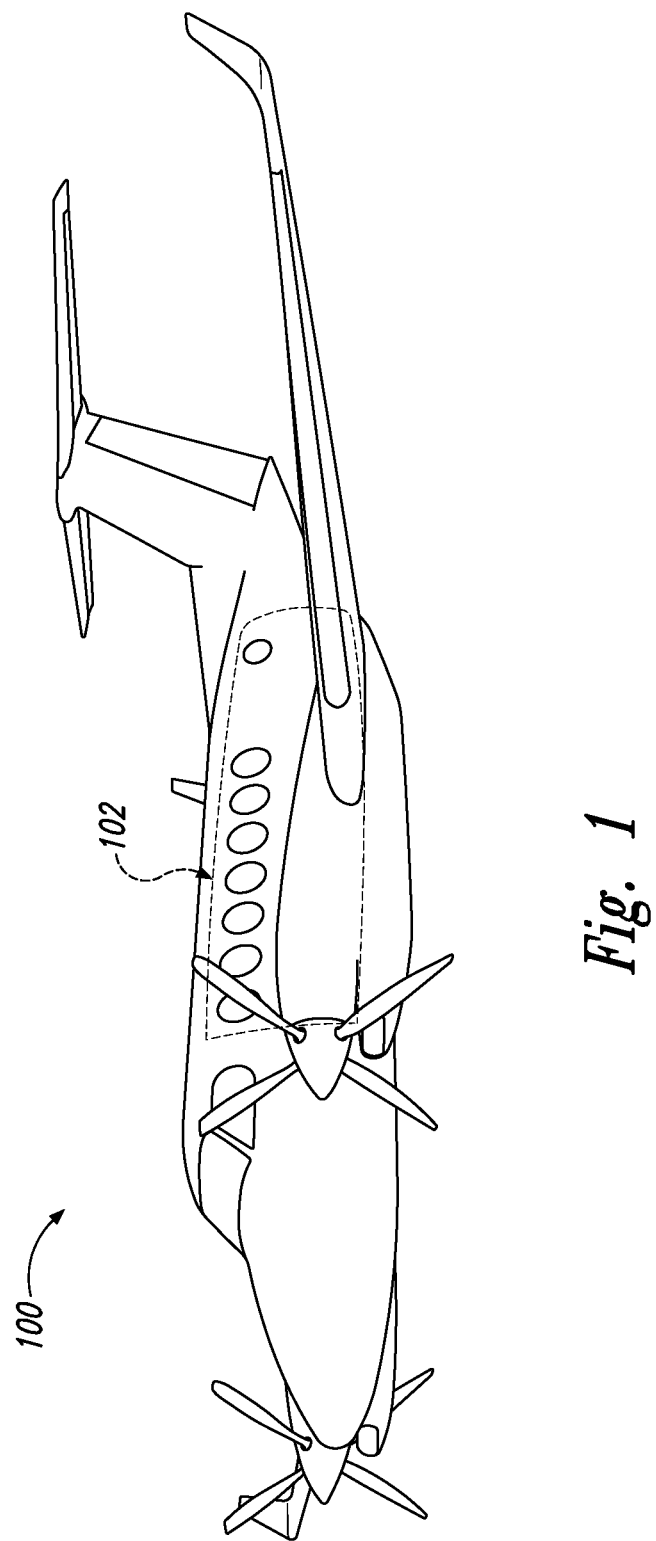
FIG. 1 is a perspective view of a mobile platform, depicted here as an aircraft, including an internal compartment.

Various embodiments are described below and illustrated in the associated drawings. Unless otherwise specified, an embodiment and/or its various components may, but are not required to, contain at least one of the structure, components, functionality, and/or variations described, and/or illustrated herein. Furthermore, the structures, components, functionalities, and/or variations described, and/or illustrated, herein in connection with the present teachings may, but are not required to, be included in other similar embodiments. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

In general, disclosed embodiments may fulfill increased cooling requirements for rack equipment (e.g., heat-generating electrical equipment components, such as computers, data storage, electronic sensor modules, and the like) on aircraft (or other mobile platforms) that previously relied on passive convection and conduction into a surrounding environment. Some embodiments may add an exhaust system to the aircraft. This additional exhaust system may draw heated air from equipment racks and duct that heated air to existing aircraft evaporators (e.g., cabin evaporators). Some embodiments may include a cooling manifold for each equipment rack, individual exhaust ducts for high-powered equipment and/or densely populated rack shelves, exhaust fans, and exhaust ducting. Airflow through the racks and into the individual exhaust ducts to the respective cooling manifolds may be drawn by one or more exhaust fans disposed in the exhaust ducting coupling associated manifold outlet(s) to the existing cabin evaporators. This airflow through the racks may provide for more effective convection cooling of equipment, and/or may minimize heat buildup in both the racks and the aircraft cabin. This thermal management approach may provide cooling air to pilots and operators first, and then utilize that cooling air to cool the equipment.

Disclosed embodiments may have built in growth capability and design flexibility. For example, the rack manifolds may include unused connections, which may allow additional cooling ducts to be added, if for example, the rack equipment changes (e.g., installation of additional equipment and/or a hardware reconfiguration creating an increased or otherwise altered thermal profile within the cabin). For example, the individual tubing ducts in the racks may be conveniently repositioned and/or relocated to address hot spots.

Accordingly, disclosed embodiments may enable increased installation of heat-generating electrical equipment components on aircraft (or other mobile platforms), particularly as compared to pre-existing aircraft and other mobile platforms, which may provide for increased mission effectiveness, particularly in relatively hot environments.

More specifically, in some embodiments, a cooling system may include a plurality of electrical equipment components, at least one manifold, a plurality of flexible tubing ducts, exhaust tubing, and at least one fan. The manifold may have multiple manifold inlet tubing connections (or inlets) configured to be selectively connected to individual flexible tubing ducts to be routed to electrical equipment as installed, to thereby accommodate incremental changes in electrical equipment. For example, the manifold inlet tubing connections and flexible tubing ducts may permit additional cooling lines to be incrementally added and positioned to address changes in thermal cooling requirements as electrical equipment is installed. In particular, the plurality of flexible tubing ducts may be extended from the plurality of electrical equipment components to the plurality of inlet manifold tubing connections, for receiving air that absorbs thermal energy from the electrical equipment components. The exhaust tubing may couple the manifold outlet to an interface with an aircraft cooling system. The fan may be installed within the exhaust tubing and configured to deliver the heated air to the aircraft cooling system.

Examples, Components, and Alternatives

The following examples describe selected aspects of exemplary embodiments, as well as related systems and/or methods. These examples are intended for illustration and should not be interpreted as limiting the entire scope of the present disclosure. Each example may include one or more distinct inventions, and/or contextual or related information, function, and/or structure.

Example 1

This example describes an illustrative system for cooling a plurality of electrical equipment components inside a mobile platform, such as an aircraft; see FIGS. 1-7.

In particular, FIG. 1 depicts a mobile platform 100 including an internal compartment 102. As shown, platform 100 may be a relatively small, fixed-wing aircraft, such as a King Air 350, and compartment 102 may correspond to an aircraft cabin. However, in other embodiments, the compartment may correspond to another internal space within the platform, and/or the platform may be another type of aircraft, such as a helicopter, or a non-aircraft type mobile platform, such as a watercraft or an automobile.

Figure 2:
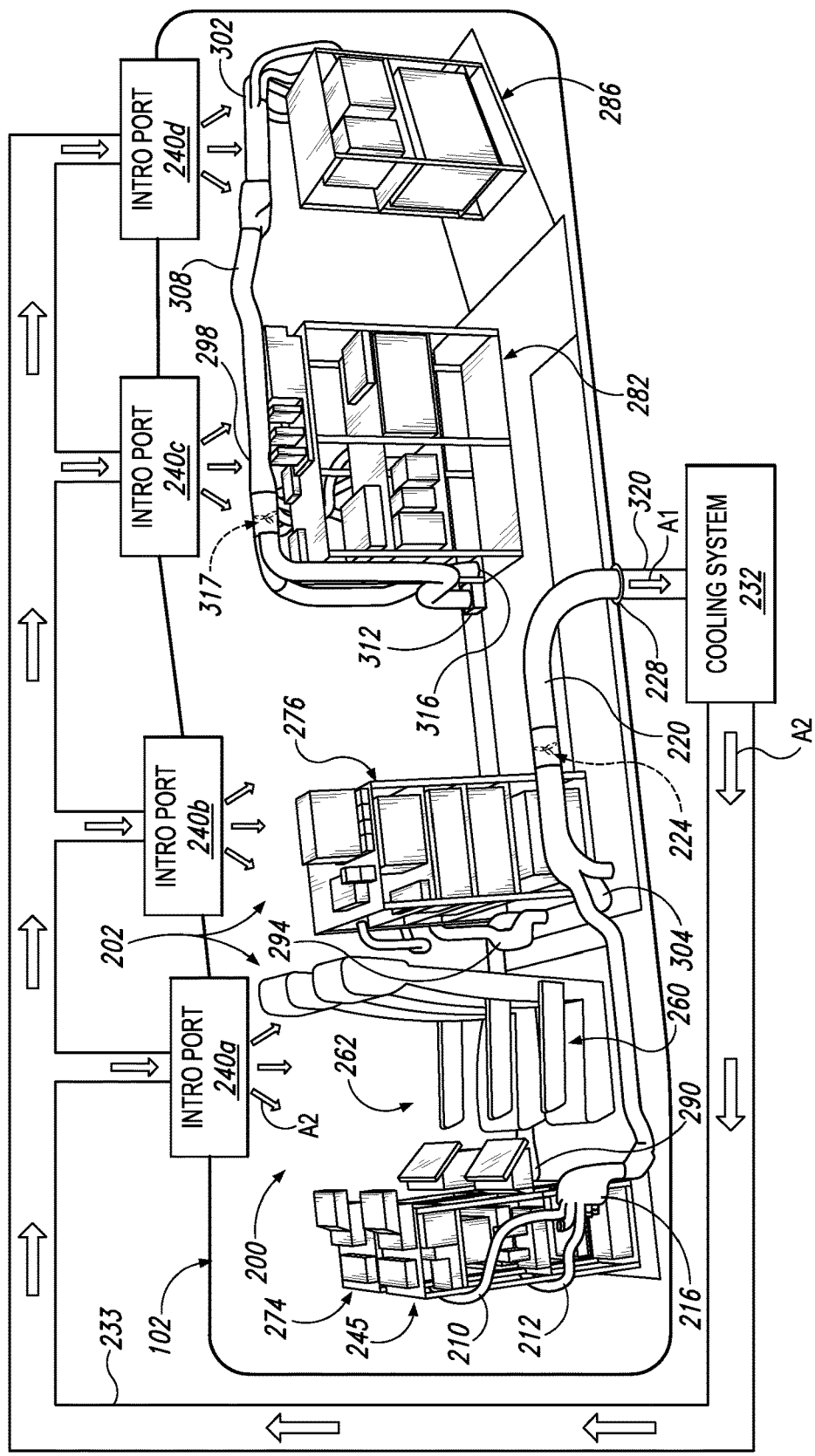
FIG. 2 is a semi-schematic view of a system including a plurality of exhaust manifolds and individual tubing ducts disposed within the compartment for cooling a plurality of electrical equipment components installed on a plurality of racks, with outlets of the manifolds coupled to a pre-existing cooling system of the mobile platform.

FIG. 2 is a semi-schematic perspective view of a system 200 for cooling a plurality of heat-generating electrical equipment components 202 inside compartment 102. System 200 may include any suitable apparatus, device, mechanism, structure, or combination thereof configured to permit an exhaust profile (and/or a cooled-air introduction profile) inside compartment 102 to be reconfigured based at least in part on respective positions of components 202 inside compartment 102. For example, system 200 may include a plurality of flexible tubing ducts, such as flexible tubing ducts 210, 212, one or more manifolds, such as manifold 216, one or more exhaust ducts (or tubing portions), such as exhaust tubing 220, and one or more fans, such as fan 224.

Figure 3:
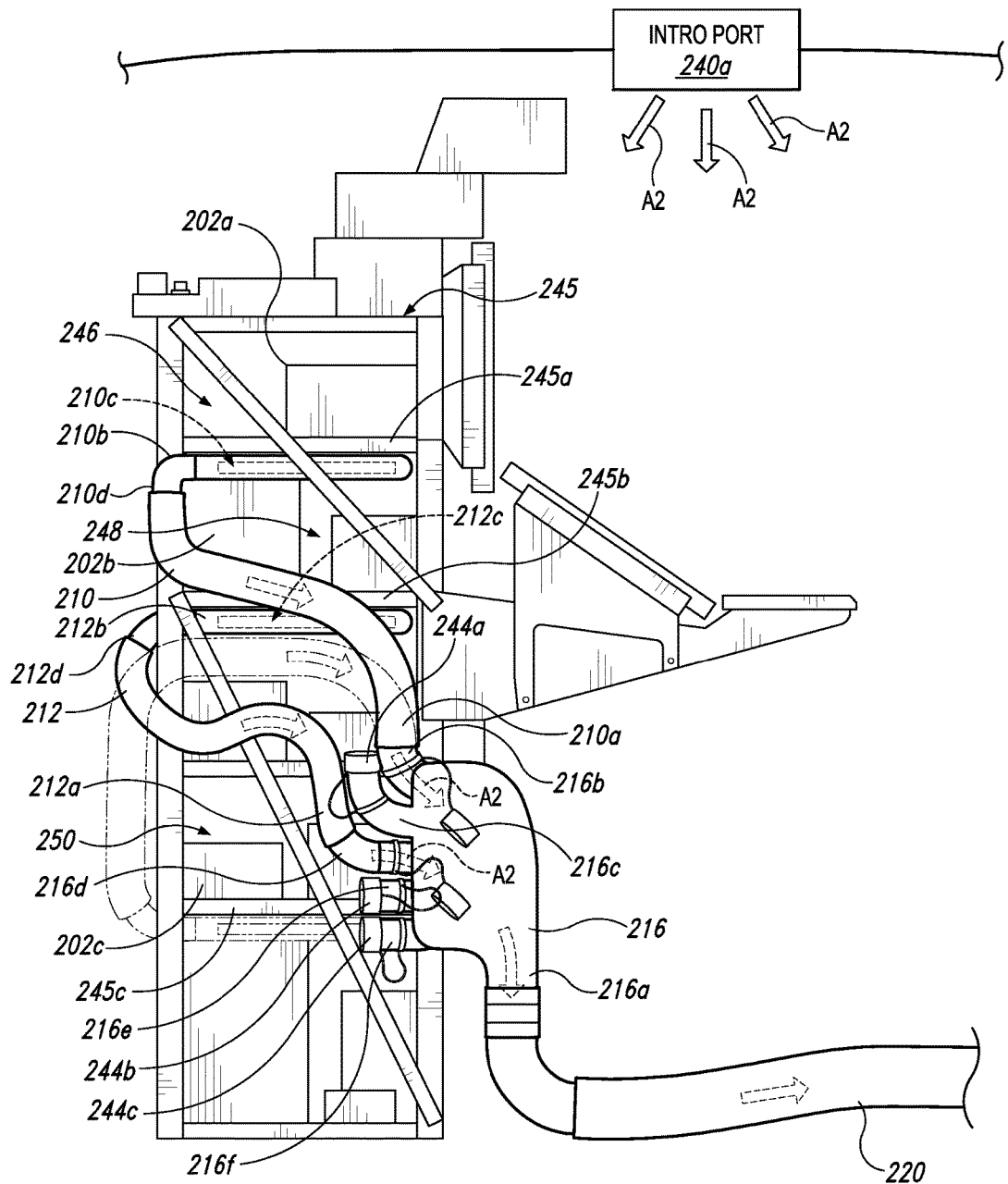
FIG. 3 is an elevation view a first manifold positioned adjacent a first rack, and two tubing ducts respectively connected to two inlets of the manifold and to two shelves of the first rack, with various elements of the compartment removed to simplify illustration.

As can be seen in FIG. 3, manifold 216 may have an outlet 216a and a plurality of inlets (or inlet tubing connections), such as inlets 216b-216f, which may be in fluid communication with outlet 216a. Outlet 216a may be coupled to an interface 228 (see FIG. 2) of a cooling system 232 by tubing 220. In particular, tubing 220 may place outlet 216a in fluid communication with interface 228.

Cooling system 232 may be (or include) a pre-existing cooling system of platform 100. For example, system 232 may include one or more pre-existing evaporators configured to receive heated air A1 through interface 228, cool heated air A1 to produce cooled air A2, and introduce cooled air A2 back into compartment 102 via ducting 233 and one or more air introduction ports, such as introduction ports 240a, 240b, 240c, 240d, which may also be pre-existing components of platform 100. For example, system 232 may be a vapor refrigeration cooling system, similar to an automotive or house system. In some embodiments, system 232 may include a single evaporator forward of a cockpit of aircraft 100, and two evaporators under a floor of compartment 102. Evaporator fans may be located within the evaporators and may draw warm return air into the evaporators where the air is cooled. Heat from the air may be transferred to refrigerant in the evaporators and then shed to outside air by a condenser located in a nose of aircraft 100. The cooled air from the evaporators may be ducted to cockpit glareshield outlets and to overhead outlets (e.g., ports 240a-d) in compartment 102. After the air cools the cockpit and cabin zones (e.g., within compartment 102), the air may be drawn back through the evaporators and the process repeated.

As shown in FIG. 2, disclosed embodiments may use pre-existing aircraft cooling system 232, and add a rack cooling system thereto, as described above in the overview. For example, the cooled air may be delivered to the cabin (e.g., compartment 102) through the cabin overhead outlets. After cooling the cabin occupants, the air may be drawn through the equipment racks into exhaust ducts and manifolds before being ducted back to the cabin evaporators. Additionally or alternatively, in some embodiments, one or more of the manifold outlets (e.g., referenced below) may be interfaced with one or more of ports 240a-d (or duct 233) and configured to deliver cooled air A2 (e.g., via the associated tubing connections) directly to electrical equipment components (e.g., coupled to associated racks).

However, in the example shown in FIGS. 2 and 3, ducts 210, 212 may be connected to the inlets of manifold 216 and routed to desired locations near components 202 to draw cooled air A2 from the introduction ports toward components 202 via an exhaust of heated air A1 near components 202. For example, as shown in FIG. 3, ducts 210, 212 may have respective proximal ends 210a, 212a, and distal ends 210b, 212b. Each of proximal ends 210a, 212a may be selectively connectable to any one of the inlets of manifold 216. In FIG. 3, proximal end 210a is selectively connected to inlet 216b, and proximal end 212a is selectively connected to inlet 216d.

Figure 4:
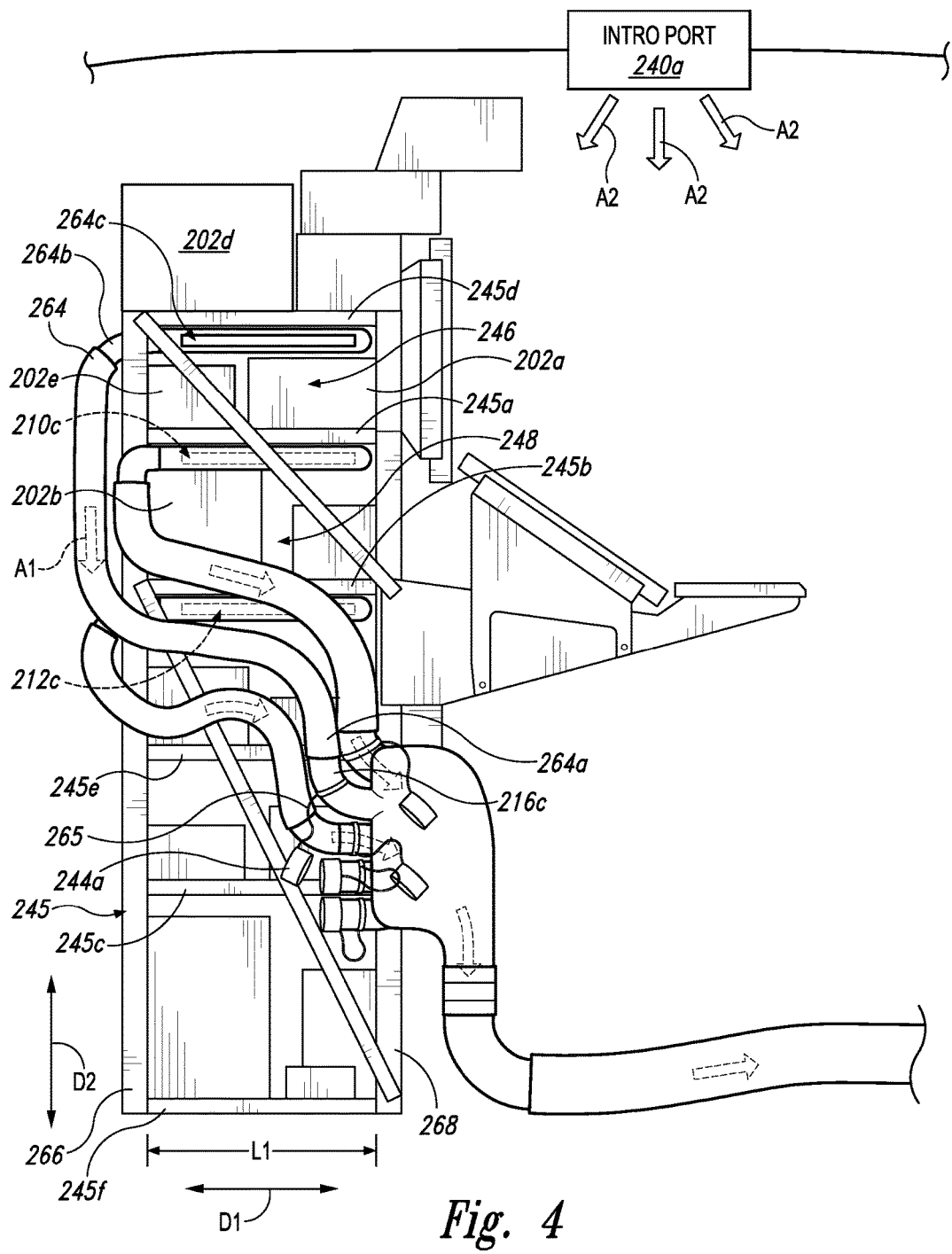
FIG. 4 is an elevation view similar to FIG. 3, but showing an additional tubing duct connected to a third inlet of the manifold and to a third shelf of the first rack to accommodate installation of additional electrical equipment components on the rack.

As also shown, system 200 may further include one or more covers (or plugs), such as covers (or plugs) 244a, 244b, 244c. While each proximal end of the associated tubing ducts may be selectively connected to the plurality of inlets, as described above (e.g., in place of a removable cover), in some embodiments, each of inlets 216b-f may be selectively connectable to a removable cover, such as one of covers 244a-c (and/or additional or other covers, which may be included) for covering the respective inlet. In particular, cover 244a is shown in FIG. 3 as being removably connected to inlet 216c, thereby substantially hermetically sealing inlet 216b when inlet 216b is not connected to a flexible tubing duct. Similarly, covers 244b, 244c are shown as removably connected to respective inlets 216e, 216f. Such a configuration of inlets and removable covers (e.g., covers 244a-c, among others) may enable the plurality of flexible tubing ducts to be incrementally added and positioned relative to a number of thermal dissipation zones as needed (e.g., as shown in FIG. 4), which may permit system 200 to be reconfigured to cool additional electrical equipment.

Distal ends 210b, 212b may have respective air intake ports 210c, 212c, shown here as facing away from a direction normal to the view of FIG. 3. Each of ports 210c, 212c may be alternatively positionable in two or more thermal dissipation zones (or convective heat zones) of components 202.

As mentioned above, such a configuration may permit the exhaust profile inside platform 100 (e.g., within compartment 102) to be reconfigured based at least in part on respective positions of components 202 inside platform 100 (e.g., within compartment 102). For example, a first subset of components 202, a few of which are respectively indicated at 202a, 202b, 202c in FIG. 3, may be disposed within compartment 102 and installed on a first component (or equipment) rack 245. As shown, manifold 216 is positioned adjacent rack 245, and in some cases may be connected to and/or otherwise coupled to rack 245, which may permit port 210c to be positioned in a thermal dissipation zone 246 of component 202a (e.g., proximal and/or in a space surrounding component 202a), and port 212c to be positioned in a thermal dissipation zone 248 of component 202b (e.g., proximal and/or in a space surrounding component 202b), as shown. For example, a thermal dissipation zone of an electrical equipment component may be defined as a space into which that electrical equipment component convectively dissipates thermal energy into the surrounding air, thereby producing heated air. As such, in some installed configurations of components 202, two or more thermal dissipation zones may overlap. For example, zones 246, 248 indicated in FIG. 3 may partially overlap, and as such, port 210c may be positioned in both of zones 246, 248.

In particular, distal ends 210b, 210c may include respective rigid members 210d, 212d in which associated ports 210c, 212c are respectively formed. As shown in FIG. 3, member 210d is selectively secured to an underside of an upper shelf 245a of rack 245 that is supporting component 202a, thereby positioning port 210c in zone 246 (and zone 248). Similarly, member 212d is shown selectively secured to an underside of a middle shelf 245b of rack 245 that is supporting component 202b, thereby positioning port 212c in zone 248.

However, either of ports 210c, 212c may be alternatively (e.g., selectively) positionable in a thermal dissipation zone 250 of component 202c, for example, if it is determined that zone 250 corresponds to a "hot spot" in an installation of components 202 within compartment 102. For example, in such a case, either of rigid members 210d, 212d may be connected to an underside of a lower shelf 245c of rack 245 that is supporting component 202c. For example, as shown in dash double dot lines in FIG. 3, rigid member 210*d* may be disconnected from shelf 245*a*, and tubing 210 may be flexed downward to permit rigid member 210*d* to be connected to the underside of shelf 245*c*. Additionally or alternatively, an additional flexible tubing duct may be connected to one of the other inlets of manifold 216, and extended to zone 250. Further, either of ports 210*c*, 212*c* may be alternatively positioned in a thermal dissipation zone associated with a newly installed component on rack 245, similar examples of which will be described below in more detail.

Such alternative position-ability may be permitted by a flexible characteristic of the associated tubing, and/or selective connect-ability of the flexible tubing ducts to one or more of the inlets of manifold 216. It should be noted that the flexible portions of tubing 210, 212 may correspond to central portions thereof (e.g., extending from the respective proximal ends to a junction region with the respective distal ends). However, in other embodiments, other portions of the tubing extending from the inlets may be flexible. For example, the proximal ends may be rigid, and the distal ends may include one or more flexible portions. Further, in some embodiments, the one or more of the inlets may be made of a flexible material, thereby further increasing a range of relocation of a flexible tubing duct connected thereto. Examples of suitable rigid materials for various duct portions of system 200 include PET and other plastics, as well as various metallic materials, such as aluminum. Examples of suitable flexible materials, which may be used for the flexible portions of the flexible tubing ducts, include silicon rubber hosing and/or other resilient materials.

With continuing reference to FIGS. 2 and 3, in some embodiments, convectively energized (e.g., heated) air from thermal dissipation zones of components 202, such as heated air A1 from respective components 202*a*, 202*b* in zones 246, 248, may be drawn through respective ports 210*c*, 212*c*, through respective ducts 210, 212 and manifold 216 via a pre-existing air-movement apparatus (e.g., an evaporator fan) included in system 232. However, in some embodiments, fan 224 may be installed within tubing 220, as shown in FIG. 2. Fan 224 may be configured to draw heated air A1 from thermal dissipation zones 246, 248 (or other zones) and through associated air intake ports 210*c*, 212*c*, and move heated air A1 serially through outlet 216*a* (via respective inlets 216*b*, 216*d*) and tubing 220 to interface 228. Heated air A1 from thermal dissipation zones 246, 248 may have absorbed thermal energy from the respective electrical equipment components 202*a*, 202*b* associated with respective thermal dissipation zones 246, 248. By exhausting heated air A1 from zones 246, 248, cooled air A2 from introduction port 240*a* may be first generally drawn toward operators (e.g., human operators of components 202) sitting in operator seats 260, 262, thereby providing cooling to those operators, and then be generally drawn toward zones 246, 248 thereby cooling components 202*a*, 202*b* (and the surrounding space and/or electrical equipment components). However, in some embodiments, cooled air from one or more of the introduction ports may cool the electrical equipment components prior to cooling the operators.

As mentioned above, the flexibility of tubing ducts extending from the inlets of the manifold(s), and/or selective connection of one or more additional tubing ducts to one or more of the additional inlets of the associated manifold, may permit an exhaust duct reconfiguration inside compartment 102 to be configured to compliment an altered thermal profile associated with a hardware reconfiguration, such as an installation of one or more additional electrical equipment components within compartment 102.

For example, as depicted in FIG. 4, the hardware reconfiguration may involve installing additional electrical equipment components 202*d*, 202*e* on respective upper shelves 245*d*, 245*a* of rack 245. Such a hardware reconfiguration may increase a thermal profile in zone 246. For example, components 202*d*, 202*e* may convectively dissipate additional thermal energy into zone 246, and/or components 202*d*, 202*e* may physically hinder dissipation of thermal energy out of zone 246. To compliment this increased thermal profile, cover 244*a* may be removed from inlet 216*c*. A proximal end 264*a* of an additional flexible tubing duct 264 may be connected to inlet 216*c*, and a distal end 264*b* having an air intake port 264*c* may be disposed in zone 246 (e.g., coupled to an underside of shelf 245*d*. By disposing additional air intake port 264*c* in zone 246 a greater volume of heated air A1 may be exhausted from zone 246, thereby further reducing buildup of thermal energy in that space, and/or further providing for increased cooling of zone 246, for example, by increasing a flow of cooled air A2 thereto.

As shown, cover 244*a* may be retained to manifold 216 when disconnected and removed from inlet 216*c*. For example, a flexible strap 265 may tether cover 244*a* to manifold 216, such that cover 244 may be retained to manifold 216 when cover 244*a* is disconnected and removed from inlet 216*c*. The other covers may similarly be retained to manifold 216 when not connected to respective inlets. In other embodiments, the covers may be retained to manifold 216 by another suitable apparatus, device, or mechanism, or combination thereof. For example, one or more slots or pockets may be formed on an exterior of the manifold, into which the disconnected covers may be positioned by a user. In other examples, tape may be used to hermetically seal the respective covers to the inlets, and/or retain one or more of the covers to the associated manifold.

As also indicated in FIG. 4, rack 245 may include at least two upright posts 266, 268. Posts 266, 268 may support shelves 245*a-f*, which are all shown as supporting one or more of components 202. A length, such as length L1, of each of these shelves may be defined between posts 266, 268 in a direction D1, which is orthogonal to an elongate direction D2 of posts 266, 268. As shown, each of air intake ports 264*c*, 210*c*, 212*c* may be characterized by an elongate opening in an outer wall of the associated rigid member, with each of elongate openings 264*c*, 210*c*, 212*c* extending along at least a majority of length L1 adjacent the associated electrical equipment component(s) when the associated rigid members are secured to respective shelves 245*d*, 245*a*, 245*b*.

As is further shown, opening 264*c* may be disposed opposite port 240*a* relative to component 202*d* installed on shelf 245*d*; opening 210*c* may be disposed opposite port 240*a* relative to components 202*a*, 202*e* installed on shelf 245*a*; and opening 212*c* may be disposed opposite port 240*a* relative to component 202*b* installed on shelf 245*b*. Such a configuration involving intake ports disposed opposite one or more of the introduction ports relative to one or more of components 202 may improve convective cooling of compartment 102 and components 202, as described above, for example, by more effectively exhausting heated air from the associated thermal dissipation zones and thereby drawing cooled air thereto. Further, the shelves of rack 245, and/or other shelves disclosed herein, may include air holes (or other suitable grating), thereby permitting greater air flow between a region above a particular shelf and a region below a particular shelf.

Moreover, the exhaust profile within compartment 102 may be further altered by disposing one or more flow-restricting, generally frusto-conical sleeves, such as one or more of sleeves 270, 272 (see FIG. 5), within one or more of inlets 216b-216f of manifold 216. For example, each of sleeves 270, 272 may be a restrictor cone produced by SENIOR AEROSPACE BWT, such as part number BWT9157-5, with sleeve 270 being trimmed to permit greater airflow there through, than as compared to non-trimmed sleeve 270.

In an exemplary use, the hardware reconfiguration shown in FIG. 4 (or another type of hardware reconfiguration), may be particularly complimented by a greater amount of heated air A1 being withdrawn out of an upper region of zone 246 than a lower portion of zone 246, and an even greater amount of heated air A1 being withdrawn out of zone 248. Accordingly, in the configuration shown in FIG. 4, sleeve 270 may be selectively disposed in inlet 216b and configured to restrict air flow through inlet 216b via tubing 210 from zone 246, such that an amount of air exhausted from the lower region of zone 246 via inlet 216b is less than an amount of air exhausted from zone 248 via inlet 216d. Further, sleeve 272 may be disposed in inlet 216c and configured to restrict air flow through inlet 216c via tubing 264, such that an amount of air exhausted from the upper region of zone 246 via inlet 216c is less than the amount of air exhausted through inlet 216d from zone 248, but greater than the amount of air exhausted through inlet 216b from the lower region of zone 246. However, in other embodiments, other suitable flow-restricting elements may be used and/or otherwise disposed in the exhaust duct configurations disclosed herein to suit various applications.

Figure 5:
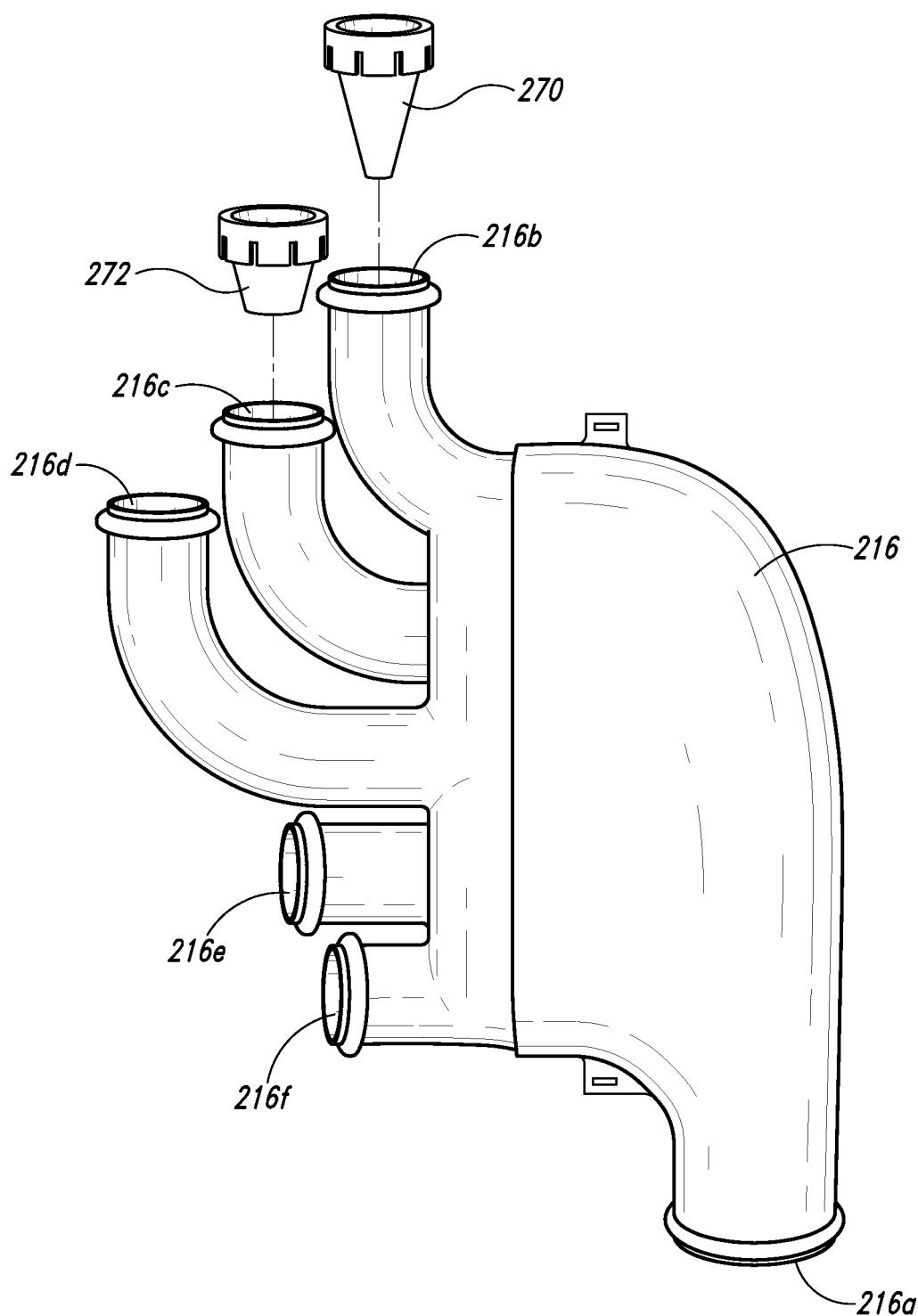
FIG. 5 is a perspective view of the first manifold, and two flow-restricting generally frusto-conical sleeves which may be selectively disposed in respective inlets of the first manifold.

As also shown in FIG. 5, beaded end fittings or flanges may surround respective inlets 216b-216f and outlet 216a, which may permit ducting to be more efficiently coupled thereto. Other coupling apparatuses may additionally or alternatively be included, such as clamps, tape, clips, fasteners, and the like. Similarly, various apparatus may be included to permit tubing 210, 212, 264 to be selectively secured to the shelves of rack 245. Examples of such suitable apparatuses include clamps, clips, fasteners, and the like.

Returning to FIG. 2, other subsets of components 202 may be installed on (and/or within) respective second, third, fourth, and fifth racks 274, 276, 278, 282, 286 within compartment 102 (e.g., either in an original hardware configuration or retrofit and/or a hardware reconfiguration or subsequent retrofit). In a similar fashion, as described above, at least one manifold may be positioned adjacent (and/or near) each of racks 274, 276, 278, 282, 286. Similar to manifold 216, each of these manifolds may have an outlet in fluid communication with cooling system 232, and a plurality of inlets to which a plurality of flexible tubing ducts may be selectively connectable and routed to desired locations proximal electrical equipment components installed on the associated rack, thereby further accommodating incremental installation changes and complimentary alteration of an exhaust profile within compartment 102.

In particular, a second manifold 290 may be positioned adjacent rack 274. While only a portion of manifold 290 is shown, manifold 290 may be similar in structure to manifold 216. Similarly, a third manifold 294 may be positioned adjacent (e.g., beside) rack 276, a fourth manifold 298 (see also FIGS. 6 and 7) may be positioned adjacent (e.g., above) rack 282, and a fifth manifold 302 may be positioned adjacent rack 286. Exhaust duct tubing 304 may place the outlets of manifolds 290, 294 in fluid communication with tubing 220, and thereby interface 228. Branching exhaust duct tubing 308 may place outlets of manifolds 298, 302 in fluid communication with second and third interfaces 312, 316, which may be in similar fluid communication with system 232 as interface 228. Similar to fan 224, another fan 317 may be installed within tubing 308 and configured to draw heated air from (and/or surrounding) racks 282, 286, through air intake ports associated with the flexible tubing ducts connected to inlets of respective manifolds 298, 302, and to interfaces 312, 316.

Figure 6:
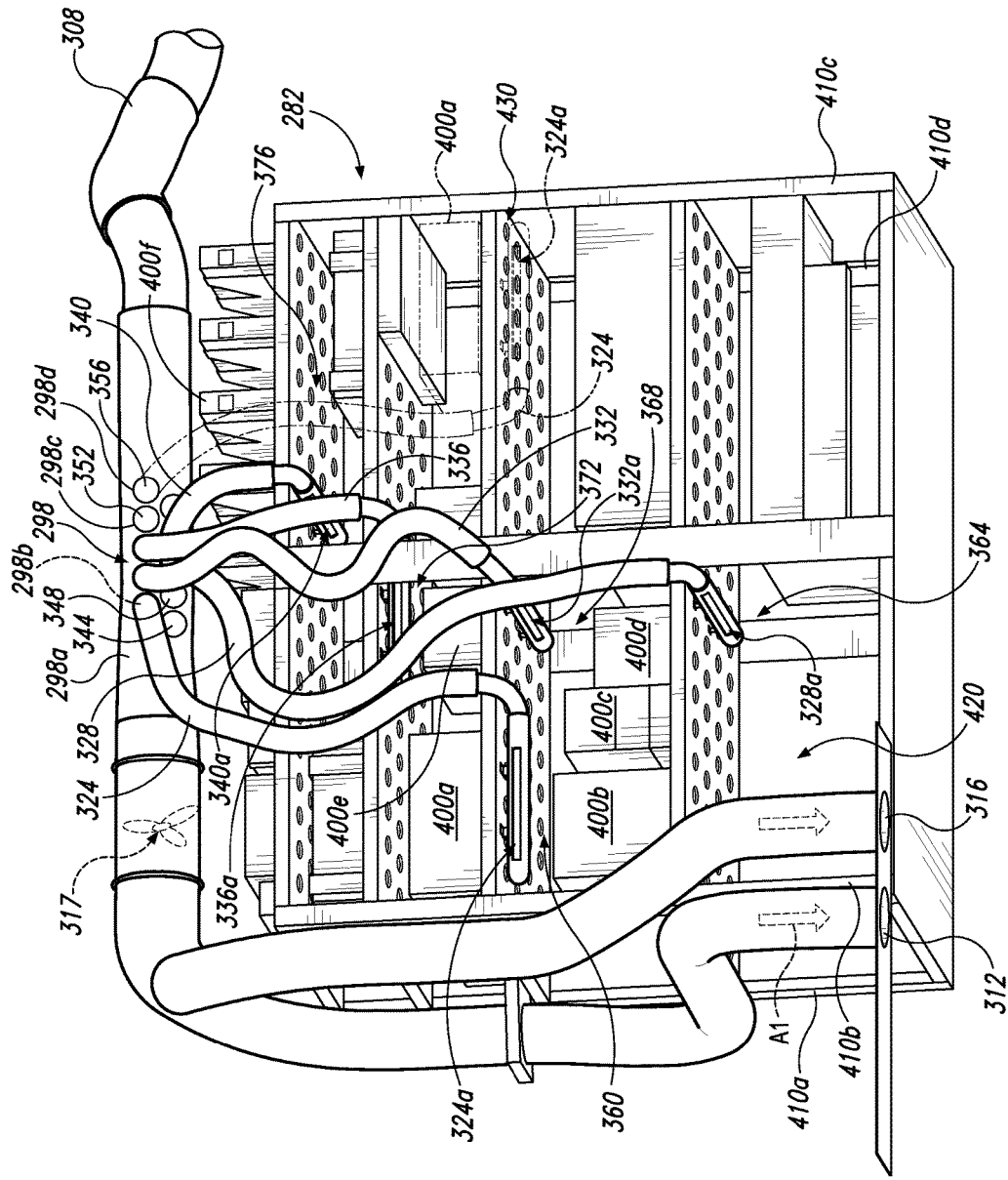
FIG. 6 is a perspective view of a second manifold positioned adjacent a second rack and a plurality of tubing ducts respectively connected to a plurality of inlets of the second manifold and to a plurality of locations on the second rack adjacent installed electrical equipment components, with a hardware reconfiguration and corresponding exhaust duct reconfiguration shown in dash double dot lines.
Figure 7:
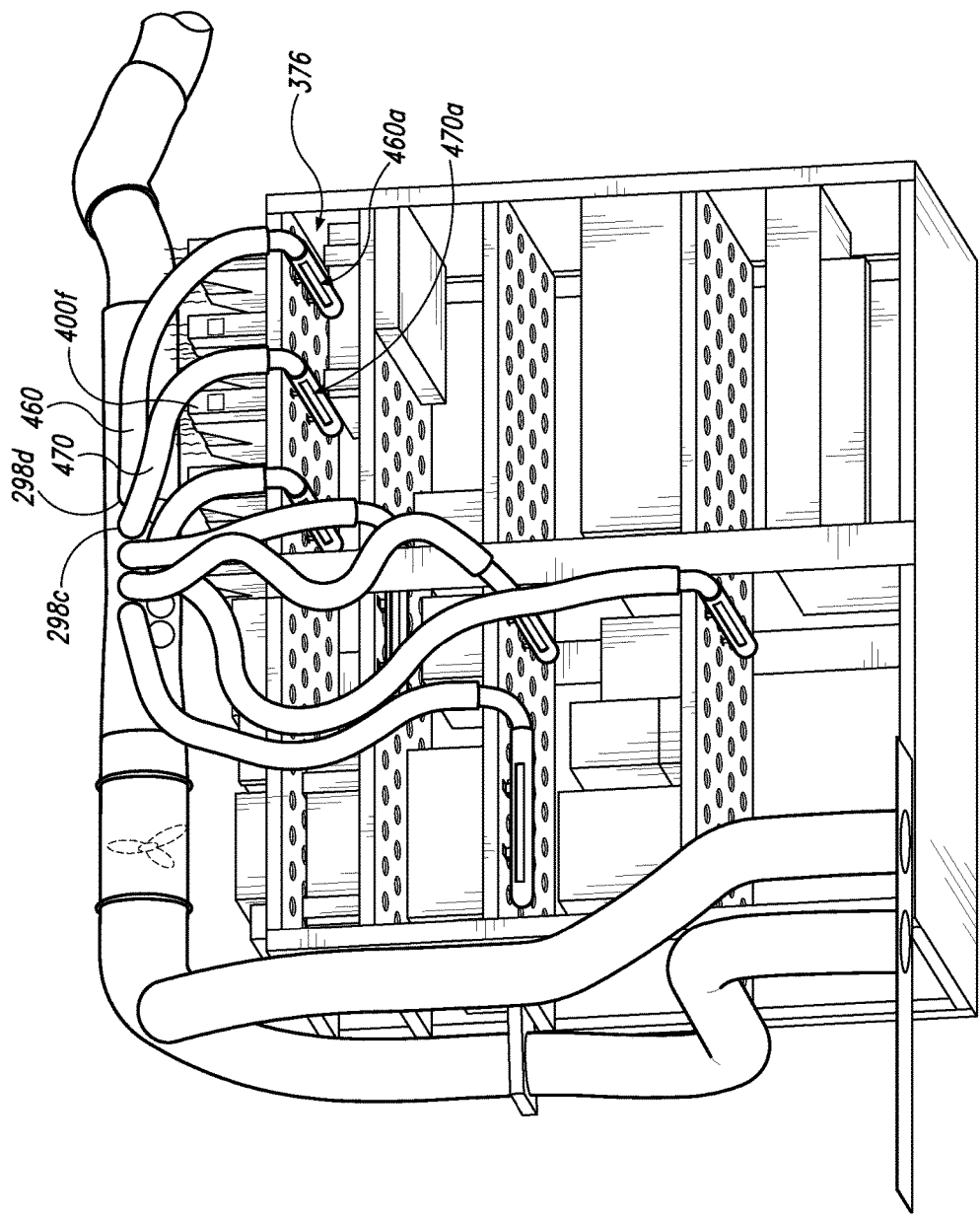
FIG. 7 is a perspective view similar to FIG. 6, but showing an exhaust duct reconfiguration to accommodate a hardware reconfiguration involving increased thermal energy dissipation from a subset of the electrical equipment components.

For example, FIGS. 6 and 7 show a rear upward perspective view of rack 282 and manifold 298. As mentioned above, similar to manifold 216, manifold 298 may include an outlet 298a and a plurality of inlets, a few of which are respectively indicated at 298b, 298c, 298d. The inlets of manifold 298 may be in fluid communication with outlet 298a. Outlet 298a may be configured for fluid communication with an exhaust duct of cooling system 232, such as one or more exhaust ducts similar to duct 320, which may connect interfaces 312, 316 with system 232 in a similar fashion. Each of the inlets of manifold 298 may be selectively connectable to one or more individual tubing ducts (e.g., similar to ducts 210, 212), such as ducts 324, 328, 332, 336, 340. Ducts 324, 328, 332, 336, 340 may be extendable to respective convective heat zone(s) of at least one of components 202 (e.g., installed on rack 298), thereby permitting the thermal exhaust profile of compartment 102 to be incrementally altered to address a change in installation of components 202 within the compartment, in a manner similar to that described above with reference to manifold 216. In particular, proximal ends of ducts 324, 328, 332, 336, 340 may be selectively connected to inlets of manifold 298, with the inlets that are not currently connected to flexible tubing ducts being hermetically sealed by respective plugs 344, 348, 352, 356.

Similar to ducts 210, 212 described above, distal ends of ducts 324, 328, 332, 336, 340 may include respective air intake ports 324a, 328a, 332a, 336a, 340a. As shown in the solid line configuration shown in FIG. 6, the distal ends of ducts 324, 328, 332, 336, 340 are selectively secured to shelves of rack 282 (e.g., undersides thereof), thereby positioning respective ports 324a, 328a, 332a, 336a, 340a in respective convective heat zones 360, 364, 368, 372, 376. For example, zone 360 may be associated with a convective thermal dissipation from electrical equipment components 400a, 400b, 400c. Zone 364 may be associated with a convective thermal dissipation from electrical equipment components 400c, 400d. Zone 368 may be associated with a convective thermal dissipation from electrical equipment components 400c, 400d, 400e. Zone 372 may be associated with a convective thermal dissipation from electrical equipment component 400e. Zone 376 may be associated with a convective thermal dissipation from electrical equipment component 400f.

As shown, rack 282 includes a plurality of structural members, such as upright posts 410a, 410b, 410c, 410d, between which a volume 420 may at least partially defined for installation of at least one (e.g., a plurality) of components 202, shown here as including components 400a-f, among others. As also shown, ducts 324, 328, 332, 336, 340 are selectively secured to rack 282 (e.g., to shelves supported by posts 410a, 410b, 410c, 410d, among others) thereby selectively positioning respective intake ports 324a, 328a, 332a, 336a, 340a within volume 420. As described above, such a configuration may permit an exhaust profile within compartment 102 to be more efficiently altered to compliment various hardware reconfigurations, and/or to more efficiently reduce thermal buildup within rack 282.

As also mentioned above, exhaust fan 317 may be installed within tubing 308 (e.g., downstream from outlet 298a). Similar to fan 224, fan 317 may be configured to draw air A1 from zones 360, 364, 368, 372, 376, through respectively associated ducts 324, 328, 332, 336, 340, and out of outlet 298a to exhaust duct(s) (e.g., extending from interfaces 312, 316 similar to duct 320) via tubing 308. Air A1 may have absorbed thermal energy from at least one of components 400a-f, and by exhausting air A1, components 400a-f may be convectively cooled. Further, this exhaust of air A1 may draw cooled air A2 from introduction port 240c (see FIG. 2) toward components 400a-f.

If it is desired to restrict air flow exhaust through any one of ducts 324, 328, 332, 336, 340 (e.g., thereby increasing air flow through the other ducts), flow-restricting sleeves, such as either of sleeves 270, 272 as described above, may be disposed in the associated inlet of manifold 298.

As shown in FIG. 6, a hardware configuration within compartment 102 (see FIG. 2) may be altered from a first state (e.g., component 400a drawn in solid in FIG. 6, shown located in a first position) to a second state (e.g., component 400a drawn in dash double dot in FIG. 6, shown located in a second position). The hardware configuration in the first state may have a thermally convective first profile (e.g., a hot spot located in zone 360). The hardware configuration in the second state may have a thermally convective second profile that is distinct from the first profile. For example, the second profile may include a hot spot in a thermal dissipation zone 430, which may be associated with the reconfigured placement of component 400a.

Accordingly, in an exemplary operation of system 200, an exhaust duct configuration of system 200 (e.g., extending from at least one exhaust manifold, such as manifold 298), may be altered from a first arrangement that compliments the first profile, such as port 324a being positioned in zone 360, to a second arrangement that compliments the second profile, such as port 324a being positioned in zone 430. For example, moving port 324a from zone 360 to zone 430 may involve disconnecting the proximal end of duct 324 from inlet 298b, removing plug 356 from inlet 298d, hermetically plugging inlet 298b with plug 356, and/or connecting the proximal end of duct 324 to inlet 298d.

Further, as shown in FIG. 7, a hardware reconfiguration, such as a reconfiguration that involves increased operation of one or more electrical equipment components, such as component 400f, may result in increased thermal energy transfer from component 400f into zone 376. Accordingly, altering the exhaust duct configuration may involve disposing additional air intake ports proximate (e.g., directly in) zone 376. For example, additional flexible tubing ducts 460, 470 may be connected to manifold 298. More specifically, proximal ends of ducts 460, 470 may be respectively coupled to inlets 298d, 298c (e.g., after those inlets are unplugged), and respective air intake ports 460a, 470a of ducts 460, 470 may be coupled to rack 282 within zone 376, thereby increasing an exhaust profile within zone 376.

While air intake ports are shown in FIGS. 2-7 as selectively securable to undersides of rack shelves, one or more of these air intake ports may be coupled to other suitable locations within compartment 102. For example, one or more air intake ports may be coupled to an upright post of a rack. Further, additionally or alternatively, one or more of the air intake ports may be configured to exhaust thermally energized air from one or more electrical equipment components disposed outside of a volume defined by structural members of a rack. For example, in FIG. 4, electrical interfaces for an operator are shown coupled to rack 245 (e.g., to post 268) in a space outside of an internal volume of rack (e.g., at least partially defined between posts 266, 268). In such an embodiment, one or more of ports 210c, 212c, 264c may exhaust heated air produced by these electrical interfaces.

Example 2

Figure 8:
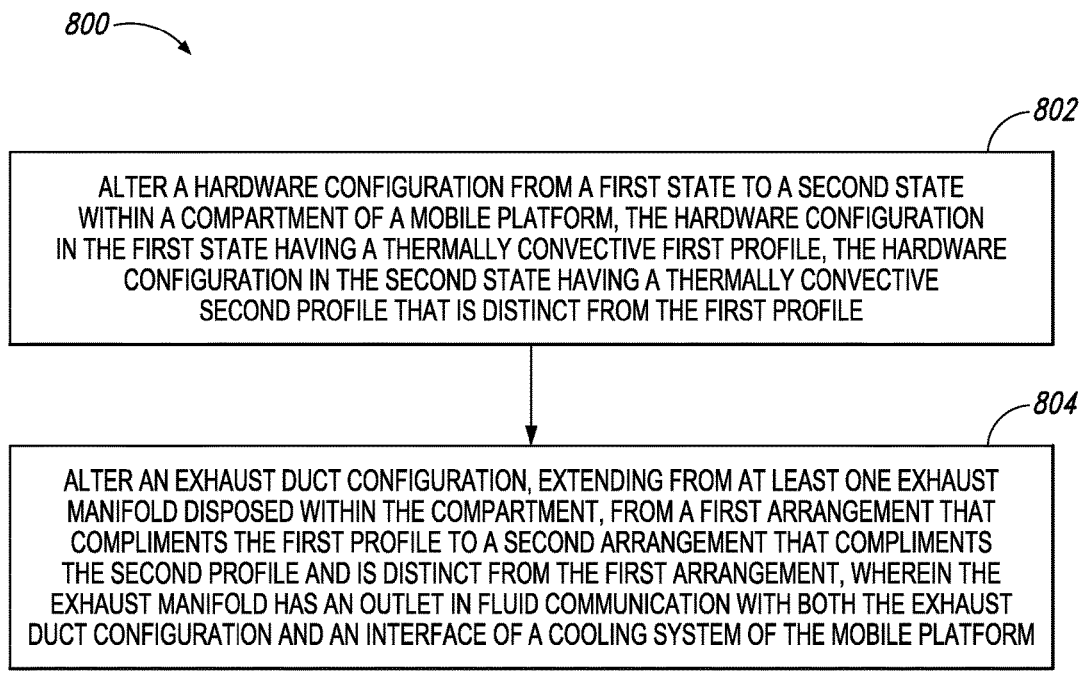
FIG. 8 is a flowchart illustrating a method.

This example describes a method; see FIG. 8. Aspects of system 200 (and/or other elements described above) may be utilized in the method steps described below. Where appropriate, reference may be made to previously described components and systems that may be used in carrying out each step. These references are for illustration, and are not intended to limit the possible ways of carrying out any particular step of the method.

FIG. 8 is a flowchart illustrating steps performed in an illustrative method, and may not recite the complete process or all steps of the program. In particular, FIG. 8 depicts multiple steps of a method, generally indicated at 800, which may be performed in conjunction with, for example, system 200, and/or variations thereof, according to aspects of the present disclosure. Although various steps of method 800 are described below and depicted in FIG. 8, the steps need not necessarily all be performed, and in some cases may be performed in a different order than the order shown.

As shown, method 800 may include a step 802 of altering a hardware configuration from a first state to a second state within a compartment, such as compartment 102, of a mobile platform, such as aircraft 100. The hardware configuration in the first state may have a thermally convective first profile. The hardware configuration in the second state may have a thermally convective second profile. The second profile may be distinct from the first profile.

Method 800 may further include a step 804 of altering an exhaust duct configuration from a first arrangement to a second arrangement. The first arrangement may compliment the first profile. The second arrangement may compliment the second profile, and/or may be distinct from the first arrangement. For example, the exhaust duct configuration (e.g., in one or more of the first and second arrangements) may extend from at least one exhaust manifold, such as any one of manifolds 216, 290, 294, 298, 302 or a combination thereof, disposed within the compartment. The manifold may have an outlet in fluid communication with both the exhaust duct configuration and an interface of a cooling system of the mobile platform, such as cooling system 232.

In some embodiments, altering the hardware configuration from the first state to the second state may involve installing an additional electrical equipment component, such as component 202e in FIG. 4, in the compartment. In such a case, among others, altering the exhaust duct configuration may involve (a) connecting a proximal end of a flexible tubing duct, such as duct 264, to an inlet of the manifold that is in fluid communication with the outlet, and/or (b) positioning an air intake port, such as port 264c, formed in a distal end of the flexible tubing duct in a convective heating zone, such as zone 246, of the additional electrical equipment component. For example, the air intake port may be formed in a rigid member comprising the distal end of the flexible tubing duct, and positioning the air intake port may involve connecting the rigid member to a rack in which the additional electrical equipment component is installed.

In some embodiments, altering the hardware configuration from the first state to the second state may involve removing an electrical equipment component from the compartment. In such a case, among others, altering the exhaust duct configuration may involve (a) disconnecting a proximal end of a flexible tubing duct from an inlet of the manifold that is in fluid communication with the outlet, and/or (b) substantially hermetically sealing the inlet with a plug. For example, such alteration of the hardware configuration may involve changing the configuration from what is shown in FIG. 4 to what is shown in FIG. 3, where components 202*d*, 202*e* are no longer installed, in which case it may be desirable to disconnect end 264*a* from inlet 216*c*, and hermetically seal inlet 216*c* with plug 244*a*, as shown in FIG. 3.

In some embodiments, the hardware configuration in both the first and second states may include an electrical equipment component, such as component 400*a* shown in FIG. 6. The exhaust duct configuration in both the first and second arrangements may include a flexible tubing duct, such as duct 324, having a proximal end connected to the manifold and in fluid communication with the outlet. In such a case, among others, altering the hardware configuration from the first state to the second state may involve moving the electrical equipment component from a first location within the compartment to a second location within the compartment, and altering the exhaust duct configuration may involve moving an air intake port, such as port 324*a*, formed in a distal end of the flexible tubing duct, from a first region proximal the first location to a second region proximal the second location. For example, altering the exhaust duct configuration may involve (a) disconnecting the proximal end of the flexible tubing duct from a first inlet (e.g., inlet 298*b*) of the manifold, and/or (b) connecting the proximal end of the flexible tubing duct to a second inlet (e.g., inlet 298*d*) of the manifold. Both of the first and second inlets may be in fluid communication with the outlet of the manifold. A distance between the second inlet and the second region may be less than a distance between the first inlet and the second region. For example, inlet 298*d* is shown as being closer to zone 430 in FIG. 6 than inlet 298*b*. Such alteration of the exhaust duct configuration may permit a single duct to be selectively extended to an increased number of thermal dissipation zones.

In some embodiments, the hardware configuration may include an electronic equipment component, such as component 400*f* shown in FIG. 7. The exhaust duct configuration may include at least first and second flexible tubing ducts, such as ducts 460, 470. Altering the hardware configuration may result in increased thermal energy transfer from the electronic equipment component into a convective heating zone, such as zone 376, disposed within the compartment and/or associated with the electronic equipment component. In such an embodiment, among others, altering the exhaust duct configuration may involve one or more of (a) positioning an air intake port of the first flexible tubing duct in the convective heating zone, with the first flexible tubing duct having a proximal end connected to a first inlet of the manifold thereby placing the air intake port of the first flexible tubing duct in fluid communication with the outlet, and (b) positioning an air intake port of the second flexible tubing duct in the convective heating zone, unplugging a second inlet of the manifold, and/or connecting a proximal end of the second flexible tubing duct to the second inlet thereby placing the air intake port of the second flexible tubing duct in fluid communication with the outlet.

Further, in some embodiments, altering the hardware configuration may involve interchanging one or more electrical equipment components between racks within the compartment, and/or altering the exhaust duct configuration may involve interchanging one or more of the flexible exhaust ducts between manifolds.

Example 3

This section describes additional aspects and features of various embodiments, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A0. A system for cooling a plurality of electrical equipment components inside an aircraft, the system comprising: at least one manifold having an outlet and a plurality of tubing connections in fluid communication with the outlet, the outlet being coupled to an interface of a cooling system of the aircraft by exhaust tubing; and a plurality of flexible tubing ducts each having a proximal end and a distal end, each proximal end being selectively connectable to the plurality of tubing connections, each distal end having an air intake port that is alternatively positionable in two or more thermal dissipation zones of the electrical equipment components for permitting an exhaust profile inside the aircraft to the interface to be reconfigured based at least in part on respective positions of the electrical equipment components inside the aircraft.

A1. The system of paragraph A0, further comprising a fan installed within the exhaust tubing, the fan being configured to draw air from the thermal dissipation zones and through the associated air intake ports and move the air serially through the outlet of the manifold and the exhaust tubing to the interface of the cooling system of the aircraft, the air having absorbed thermal energy from the electrical equipment components associated with the respective thermal dissipation zones.

A2. The system of paragraph A1, wherein the at least one manifold is positioned adjacent a rack having at least one shelf on which a first electrical equipment component of the plurality of electrical equipment components is installed.

A3. The system of paragraph A2, wherein at least one of the distal ends includes a rigid member in which the associated air intake port is formed, the rigid member being selectively securable to an underside of the shelf for positioning the associated air intake port in a thermal dissipation zone of the first electrical equipment component.

A4. The system of paragraph A3, wherein the rack includes at least two upright posts supporting the shelf, a length of the shelf being defined between the posts in a direction orthogonal to an elongate direction of the posts, the air intake port defined by the rigid member being characterized by an elongate opening in an outer wall of the rigid member, the elongate opening extending along at least a majority of the length of the shelf adjacent the first electrical equipment component when the rigid member is secured to the underside of the shelf.

A5. The system of paragraph A4, wherein the plurality of electrical equipment components, the manifold, and the flexible tubing ducts are disposed within a compartment of the aircraft, the cooling system being configured to cool the air received from the outlet of the manifold thereby producing cooled air and to introduce the cooled air into the compartment via at least one introduction port, the elongate opening being positioned opposite the at least one introduction port relative to the first electrical equipment component installed on the shelf, whereby cooled air introduced into the compartment via the at least one introduction port is drawn toward the first electrical equipment component installed on the shelf by the air from the thermal dissipation zone of the first electrical equipment component being exhausted from the compartment via the elongate opening.

A6. The apparatus of paragraph A0, further comprising one or more covers removably connected to the inlet tubing connections for respectively substantially hermetically sealing one or more of the inlet tubing connections of the manifold when those one or more inlet tubing connections are not connected to respective flexible tubing ducts, wherein the one or more covers are retained to the manifold when disconnected and removed from the inlet tubing connections.

A7. The apparatus of paragraph A6, wherein the plurality of inlet tubing connections and removable covers enable the plurality of flexible tubing ducts to be incrementally added and positioned relative to a number of thermal dissipation zones as needed to permit the system for cooling a plurality of electrical equipment components to be reconfigured to cool additional electrical equipment.

B0. An apparatus, comprising: a manifold having an outlet and a plurality of inlets in fluid communication with the outlet, the outlet being configured for fluid communication with an exhaust duct of a cooling system of a mobile platform, the mobile platform having a compartment in which a plurality of electrical equipment components are installed, wherein each inlet is selectively connectable to an individual tubing duct that is extendable to a convective heat zone of at least one of the electrical equipment components, thereby permitting a thermal exhaust profile of the compartment to be incrementally altered to address a change in installation of the electrical equipment components within the compartment.

B1. The apparatus of paragraph B0, further comprising an exhaust fan installed within exhaust tubing that places the outlet in fluid communication with the exhaust duct of the cooling system, the exhaust fan being configured to draw air from the convective heat zones, through the associated individual tubing ducts, and out of the outlet to the exhaust duct via the exhaust tubing, the air having absorbed thermal energy from at least one of the electrical equipment components associated with the respective convective heat zone.

B2. The apparatus of paragraph B0, wherein the manifold is positioned within the compartment near a rack in which at least one of the electrical equipment components is installed.

B3. The apparatus of paragraph B2, wherein the apparatus includes the individual tubing ducts, the rack including a plurality of structural members between which a volume is at least partially defined for installation of at least one of the electrical equipment components, the individual tubing ducts being selectively securable to the rack thereby selectively positioning respective intake ports of the individual tubing ducts within the volume.

B4. The apparatus of paragraph B0, further comprising one or more plugs for respectively substantially hermetically sealing one or more of the inlets of the manifold when those one or more inlets are not connected to respective individual tubing ducts.

B5. The apparatus of paragraph B0, further comprising: a flow-restricting generally frusto-conical sleeve selectively disposed within a first inlet of the plurality of inlets, a first individual tubing duct extending from the first inlet to a first convective heat zone associated with a first electrical equipment component of the plurality of electrical equipment components; and a second individual tubing duct extending from a second inlet of the plurality of inlets to a second convective heat zone associated with a second electrical equipment component of the plurality of electrical equipment components; wherein the sleeve is configured to restrict air flow through the first inlet via the first individual tubing duct from the first convective heat zone when the sleeve is disposed in the first inlet, such that an amount of air exhausted from the first convective heat zone via the first inlet is less than an amount of air exhausted from the second convective heat zone via the second inlet.

C0. A method, comprising: altering a hardware configuration from a first state to a second state within a compartment of a mobile platform, the hardware configuration in the first state having a thermally convective first profile, the hardware configuration in the second state having a thermally convective second profile that is distinct from the first profile; and altering an exhaust duct configuration, extending from at least one exhaust manifold disposed within the compartment, from a first arrangement that compliments the first profile to a second arrangement that compliments the second profile and is distinct from the first arrangement, wherein the exhaust manifold has an outlet in fluid communication with both the exhaust duct configuration and an interface of a cooling system of the mobile platform.

C1. The method of paragraph C0, wherein altering the hardware configuration from the first state to the second state involves installing an additional electrical equipment component in the compartment, and altering the exhaust duct configuration involves (a) connecting a proximal end of a flexible tubing duct to an inlet of the manifold that is in fluid communication with the outlet, and (b) positioning an air intake port formed in a distal end of the flexible tubing duct in a convective heating zone of the additional electrical equipment component.

C2. The method of paragraph C1, wherein the air intake port is formed in a rigid member comprising the distal end of the flexible tubing duct, and positioning the air intake port involves connecting the rigid member to a rack in which the additional electrical equipment component is installed.

C3. The method of paragraph C0, wherein altering the hardware configuration from the first state to the second state involves removing an electrical equipment component from the compartment, and altering the exhaust duct configuration involves (a) disconnecting a proximal end of a flexible tubing duct from an inlet of the manifold that is in fluid communication with the outlet, and (b) substantially hermetically sealing the inlet with a plug.

C4. The method of paragraph C0, wherein the hardware configuration in both the first and second states includes an electrical equipment component, the exhaust duct configuration in both the first and second arrangements including a flexible tubing duct having a proximal end connected to the manifold and in fluid communication with the outlet, and altering the hardware configuration from the first state to the second state involves moving the electrical equipment component from a first location within the compartment to a second location within the compartment, and altering the exhaust duct configuration involves moving an air intake port formed in a distal end of the flexible tubing duct from a first region proximal the first location to a second region proximal the second location.

C5. The method of paragraph C4, wherein altering the exhaust duct configuration involves (a) disconnecting the proximal end of the flexible tubing duct from a first inlet of the manifold, and (b) connecting the proximal end of the flexible tubing duct to a second inlet of the manifold, both of the first and second inlets being in fluid communication with the outlet of the manifold, a distance between the second inlet and the second region being less than a distance between the first inlet and the second region.

C6. The method of paragraph C0, wherein the hardware configuration includes an electronic equipment component, the exhaust duct configuration includes at least first and second flexible tubing ducts, altering the hardware configuration results in increased thermal energy transfer from the electronic equipment component into a convective heating zone disposed within the compartment and associated with the electronic equipment component, and altering the exhaust duct configuration involves one or more of (a) positioning an air intake port of the first flexible tubing duct in the convective heating zone, the first flexible tubing duct having a proximal end connected to a first inlet of the manifold thereby placing the air intake port of the first flexible tubing duct in fluid communication with the outlet, and (b) positioning an air intake port of the second flexible tubing duct in the convective heating zone, unplugging a second inlet of the manifold, and connecting a proximal end of the second flexible tubing duct to the second inlet thereby placing the air intake port of the second flexible tubing duct in fluid communication with the outlet.

D0. A system for cooling a plurality of heat-generating electrical equipment components inside a compartment of a mobile platform, the system comprising: a plurality of flexible tubing ducts disposed in the compartment, each tubing duct having a distal end and a proximal end, each distal end including an air intake port that is alternatively positionable between two or more spaced apart thermal dissipation zones associated with an installation of the electrical equipment components, each proximal end being configured to place the associated air intake port in fluid communication with an exhaust portion of a cooling system of the mobile platform, thereby permitting an exhaust profile inside the compartment to be reconfigured based at least in part on the installation of the electrical equipment components.

Advantages, Features, Benefits

The different embodiments described herein, such as system 200 and/or method 800, provide several advantages over known solutions for thermal management within a compartment of a mobile platform. For example, the illustrative embodiments described herein allow for thermally energized air to be directly exhausted from equipment racks. Additionally, and among other benefits, illustrative embodiments described herein allow an exhaust profile within a compartment of a mobile platform to be reconfigured based at least in part on locations of electrical equipment components within the compartment, for example, without adding a second cooling system to the mobile platform. However, not all embodiments described herein provide the same advantages or the same degree of advantage.

Conclusion

The disclosure set forth above may encompass multiple distinct embodiments with independent utility. Although each of these embodiments has been disclosed in its preferred form(s), the specific details of which as disclosed and illustrated herein are not to be considered in a limiting sense, because numerous variations are possible. The subject matter of the embodiments includes all novel and nonobvious combinations and subcombinations of the various elements, features, functions, and/or properties disclosed herein. The following claims particularly point out certain combinations and subcombinations regarded as novel and nonobvious. Embodiments of other combinations and subcombinations of features, functions, elements, and/or properties may be claimed in applications claiming priority from this or a related application. Such claims, whether directed to a different embodiment or to the same embodiment, and whether broader, narrower, equal, or different in scope to the original claims, also are regarded as included within the subject matter of the embodiments of the present disclosure.

What is claimed is:

1. A system for cooling a plurality of electrical equipment components inside an aircraft, the system comprising:
    at least one manifold having an outlet and a plurality of inlet tubing connections in fluid communication with the outlet, each of the plurality of inlet tubing connections being connectable to a removable cover for covering the inlet tubing connection, and the outlet being coupled to an interface of a cooling system of the aircraft by exhaust tubing; and
    a plurality of flexible tubing ducts each having a proximal end and a distal end, each proximal end being selectively connectable to the plurality of inlet tubing connections in place of a removable cover, each distal end having an air intake port that is selectively positionable in two or more thermal dissipation zones of the electrical equipment components for permitting an exhaust profile inside the aircraft to be reconfigured based at least in part on respective positions of the electrical equipment components inside the aircraft,
    wherein the at least one manifold is positioned adjacent a rack having a shelf on which a first electrical equipment component of the plurality of electrical equipment components is installed, and wherein at least one of the distal ends includes a rigid member in which the associated air intake port is formed, the rigid member being selectively securable to an underside of the shelf for positioning the associated air intake port in a thermal dissipation zone under the first electrical equipment component such that air flows from the first electrical equipment component through the shelf, to the associated air intake port.

2. The system of claim 1, further comprising a fan installed within the exhaust tubing, the fan being configured to draw air from the thermal dissipation zones and through the associated air intake ports and move the air serially through the outlet of the manifold and the exhaust tubing to the interface of the cooling system of the aircraft, the air having absorbed thermal energy from the electrical equipment components associated with the respective thermal dissipation zones.

3. The system of claim 1, wherein the rack includes at least two upright posts supporting the shelf, a length of the shelf being defined between the posts in a direction orthogonal to an elongate direction of the posts, the air intake port defined by the rigid member being characterized by an elongate opening in an outer wall of the rigid member, the elongate opening extending along at least a majority of the length of the shelf adjacent the first electrical equipment component when the rigid member is secured to the underside of the shelf, wherein the plurality of electrical equipment components, the manifold, and the flexible tubing ducts are disposed within a compartment of the aircraft, the cooling system being configured to cool the air received from the outlet of the manifold thereby producing cooled air and to introduce the cooled air into the compartment via at least one introduction port, the elongate opening being positioned opposite the at least one introduction port relative to the first electrical equipment component installed on the shelf, whereby cooled air introduced into the compartment via the at least one introduction port is drawn toward the first electrical equipment component installed on the shelf by the air from the thermal dissipation zone of the first electrical equipment component being exhausted from the compartment via the elongate opening.

4. The system of claim 1, wherein each removable cover is configured to substantially hermetically seal one or more of the inlet tubing connections of the manifold when those one or more inlet tubing connections are not connected to respective flexible tubing ducts, wherein the one or more covers are retained to the manifold when disconnected and removed from the inlet tubing connections.

5. The system of claim 4, wherein the plurality of inlet tubing connections and removable covers enable the plurality of flexible tubing ducts to be incrementally added and positioned relative to a number of thermal dissipation zones as needed to permit the system for cooling a plurality of electrical equipment components to be reconfigured to cool additional electrical equipment.

6. The system of claim 1, wherein each inlet tubing connection is selectively connectable to an individual tubing duct that is extendable to a convective heat zone of at least one of the electrical equipment components, thereby permitting a thermal exhaust profile of the rack to be incrementally altered to address a change in installation of the electrical equipment components on the rack.

7. The system of claim 1, further comprising an exhaust fan installed within the exhaust tubing that places the outlet in fluid communication with an exhaust duct of the cooling system, the exhaust fan being configured to draw air from convective heat zones, through the associated individual tubing ducts, and out of the outlet to the exhaust duct via the exhaust tubing, the air having absorbed thermal energy from at least one of the electrical equipment components associated with the respective convective heat zone.

8. The system of claim 1, wherein the manifold and the rack are positioned within a cooling compartment.

9. The system of claim 1, further comprising:
a flow-restricting frusto-conical sleeve selectively disposed within a first inlet tubing connection of the plurality of inlet tubing connections, a first individual tubing duct extending from the first inlet tubing connection to a first convective heat zone associated with a first electrical equipment component of the plurality of electrical equipment components; and
a second individual tubing duct extending from a second inlet tubing connection of the plurality of inlet tubing connections to a second convective heat zone associated with a second electrical equipment component of the plurality of electrical equipment components;
wherein the sleeve is configured to restrict air flow through the first inlet tubing connection via the first individual tubing duct from the first convective heat zone when the sleeve is disposed in the first inlet tubing connection, such that an amount of air exhausted from the first convective heat zone via the first inlet tubing connection is less than an amount of air exhausted from the second convective heat zone via the second inlet tubing connection.

10. A system for cooling a plurality of electrical equipment components inside an aircraft, the system comprising:
at least one manifold having an outlet and a plurality of inlet tubing connections in fluid communication with the outlet, each of the plurality of inlet tubing connections being connectable to a removable cover for covering the inlet tubing connection, and the outlet being coupled to an interface of a cooling system of the aircraft by exhaust tubing;
a plurality of flexible tubing ducts each having a proximal end and a distal end, each proximal end being selectively connectable to the plurality of inlet tubing connections in place of a removable cover, and each distal end having an air intake port;
a rack having an upper shelf and a lower shelf, each shelf being configured to support a heat-generating avionics component; and
a first thermal dissipation zone above the upper shelf, and a second thermal dissipation zone between the upper shelf and the lower shelf;
wherein the distal end of each flexible tubing duct has a rigid member defining the air intake port, the rigid member being movable between the first and second thermal dissipation zones and selectively attachable to an underside of a selected shelf such that air flows from the heat-generating avionics component through the shelf, to the associated air intake port.

11. The system of claim 10, wherein the at least one manifold is connected to the rack.

12. The system of claim 1, wherein the shelf is configured to allow airflow between the first electrical component installed on the shelf and the underside of the shelf.

13. The system of claim 1, wherein the shelf includes a plurality of apertures.

14. The system of claim 1, wherein the cooling system of the aircraft includes an outlet port and the rigid member is secured to the shelf such that the air intake port of the rigid member is opposite the outlet port of the cooling system relative to the first electrical component.

15. The system of claim 10, further comprising a fan installed within the exhaust tubing, the fan being configured to draw air from the thermal dissipation zones and through the air intake ports and move the air serially through the outlet of the manifold and the exhaust tubing to the interface of the cooling system of the aircraft, the air having absorbed thermal energy from heat-generating avionics components associated with the thermal dissipation zones.

16. The system of claim 10, wherein the air intake port defined by each rigid member is characterized by an elongate opening in an outer wall of the rigid member.

17. The system of claim 10, wherein each removable cover is configured to substantially hermetically seal one or more of the inlet tubing connections of the manifold when those one or more inlet tubing connections are not connected to respective flexible tubing ducts, wherein the one or more covers are retained to the manifold when disconnected and removed from the inlet tubing connections.

18. The system of claim 17, wherein the plurality of inlet tubing connections and removable covers enable the plurality of flexible tubing ducts to be incrementally added and positioned relative to a number of thermal dissipation zones as needed to permit the system for cooling a plurality of electrical equipment components to be reconfigured to cool additional electrical equipment.

19. The system of claim 10, wherein each inlet tubing connection is selectively connectable to an individual tubing duct that is extendable to a convective heat zone of at least one heat-generating avionics component, thereby permitting a thermal exhaust profile of the rack to be incrementally altered to address a change in installation of the avionics components on the rack.

20. The system of claim 10, further comprising:
- a flow-restricting frusto-conical sleeve selectively disposed within a first inlet tubing connection of the plurality of inlet tubing connections, a first individual tubing duct extending from the first inlet tubing connection to a first convective heat zone associated with a first heat generating avionics component; and
- a second individual tubing duct extending from a second inlet tubing connection of the plurality of inlet tubing connections to a second convective heat zone associated with a second heat generating avionics component;
- wherein the sleeve is configured to restrict air flow through the first inlet tubing connection via the first individual tubing duct from the first convective heat zone when the sleeve is disposed in the first inlet tubing connection, such that an amount of air exhausted from the first convective heat zone via the first inlet tubing connection is less than an amount of air exhausted from the second convective heat zone via the second inlet tubing connection.

* * * * *